US007546572B1

(12) United States Patent  
Ballagh et al.

(10) Patent No.: US 7,546,572 B1  
(45) Date of Patent: Jun. 9, 2009

(54) SHARED MEMORY INTERFACE IN A PROGRAMMABLE LOGIC DEVICE USING PARTIAL RECONFIGURATION

(75) Inventors: Jonathan B. Ballagh, Boulder, CO (US); Roger B. Milne, Boulder, CO (US); Nabeel Shirazi, San Jose, CA (US); Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 537 days.

(21) Appl. No.: 11/230,879

(22) Filed: Sep. 20, 2005

(51) Int. Cl.
*H03K 17/693* (2006.01)
(52) U.S. Cl. ...................................... 716/16
(58) Field of Classification Search .............. 716/16
See application file for complete search history.

(56) References Cited

U.S. PATENT DOCUMENTS

2005/0193359 A1* 9/2005 Gupta et al. ................ 716/18
2006/0015674 A1* 1/2006 Murotake .................. 711/101

OTHER PUBLICATIONS

Mignolet, J.-Y.; Nollet, V.; Coene, P.; Verkest, D.; Vernalde, S.; Lauwereins, R. Infrastructure for design and management of relocatable tasks in a heterogeneous reconfigurable system-on-chip. Design, Automation and Test in Europe Conference and Exhibition, 2003, pp. 986-991.*

Xilinx, Inc.; XAPP138; "Virtex FPGA Series Configuration and Readback"; (v2.8), Mar. 11, 2005; available from Xilinx, Inc., 2100 Logic drive, San Jose, California 95124; pp. 1-37.
Xilinx, Inc.; XAPP139; "Configuration and Readback of Virtex FPGAs Using (JTAG) Boundary Scan"; (v1.6), Sep. 12, 2003; available from Xilinx, Inc., 2100 Logic drive, San Jose, California 95124; pp. 1-17.
Xilinx, Inc.; XAPP290; "Two Flows for Partial Reconfiguration: Module Based or Difference Based"; (v1.2), Sep. 9, 2004; available from Xilinx, Inc., 2100 Logic drive, San Jose, California 95124; pp. 1-28.

* cited by examiner

*Primary Examiner*—Jack Chiang
*Assistant Examiner*—Aric Lin
(74) *Attorney, Agent, or Firm*—LeRoy D. Maunu; Lois D. Cartier

(57) ABSTRACT

Partial reconfiguration of a programmable logic device is used in combination with a shared memory block for communicating between two blocks of an electronic circuit design. In one embodiment, a shared memory is implemented on RAM resources of a field programmable gate array (FPGA), and a first design block implemented in resources of the FPGA is coupled to the shared memory. A second design block is also coupled to the shared memory. In response to a write request by the second design block, a process determines the RAM resources of the FPGA that correspond to the shared memory address in the write request. A configuration bitstream is generated to include configuration data for partial reconfiguration of the FPGA with the data from the write request at the appropriate RAM resources. The FPGA is partially reconfigured with the configuration bitstream via a configuration port of the FPGA.

19 Claims, 9 Drawing Sheets

SHARED MEMORY INTERFACE IN A PROGRAMMABLE LOGIC DEVICE USING PARTIAL RECONFIGURATION

FIELD OF THE INVENTION

The present invention generally relates to a shared memory interface implemented in a programmable logic device (PLD).

BACKGROUND

During the process of developing a circuit design, the behavior of the design is simulated based on a specification of the circuit design. Simulating the design helps to verify correct behavior prior to physical implementation of the circuit. Wasted manufacturing costs due to faulty design may thereby be avoided.

Numerous tools are available for preparing and simulating circuit designs including, for example, high-level modeling systems (HLMSs). Co-simulation may also be used when the design may be more efficiently simulated by simulating different parts of the design on different simulation platforms ("co-simulation platforms").

Example co-simulation platforms include both software-based and hardware-based systems. In a software-based system, a portion of the design is emulated with software running on a workstation, for example. In a hardware-based co-simulation system, a portion of the design is emulated on a hardware platform that includes a programmable logic device (PLD), such as a field programmable gate array (FPGA). Co-simulation using a hardware platform may reduce the time required for a simulation run while also providing real-time hardware verification and debug capabilities. The Modelsim simulator and the NC-SIM simulator from Cadence are example software-based systems, and the Wildcard development platform from Annapolis Microsystems and the Benone development platform from Nallatech are example hardware-based systems. The WildCard and Benone platforms are often used for algorithm exploration and design prototyping.

Most design tools recognize and support a hierarchical specification of the design, which allows the design to be specified and viewed at different levels of abstraction. The term "block" is sometimes used to refer to a collection of parts of a design that perform a function. Blocks consume inputs and produce outputs as a function of internal state; blocks are connected by arcs, and arcs conduct data between blocks. At some level in this hierarchical framework, simulating the design involves moving data from one block of the design to another block of the design.

An HLMS, such as System Generator for DSP (Sysgen) from Xilinx, Inc. of San Jose, Calif., may permit a block of a circuit design to be translated into PLD configuration data that may be used to configure a hardware-based co-simulation platform. The HLMS may include a "hardware co-simulation block" as a proxy for the hardware-based co-simulation platform. Like other blocks of the circuit design, the hardware co-simulation block consumes inputs and produces outputs. The hardware co-simulation block transfers the inputs for the block from the HLMS to the hardware-based co-simulation platform and transfers the outputs of the block from the hardware-based co-simulation platform to the HLMS.

The overhead associated with the data transfer between the HLMS and the hardware-based co-simulation platform may limit the performance for the simulation. For example, performance may be severely impacted in simulating a system requiring large amounts of data transfer, such as real-time signal processing applications including video and image processing.

The present invention may address one or more of the above issues.

SUMMARY OF THE INVENTION

The various embodiments of the invention provide a shared memory interface for blocks of an electronic circuit design by way of partial reconfiguration capabilities of a Programmable Logic Device (PLD), for example, a field programmable gate array (FPGA). In one embodiment, a shared memory is implemented on RAM resources of a PLD, and a first design block implemented in resources of the PLD is coupled to the shared memory. A second design block is also coupled to the shared memory. In response to a write request by the second design block, a process determines the RAM resources of the PLD that correspond to the shared memory address in the write request. A configuration bitstream is generated to include configuration data for partial reconfiguration of the PLD with the data from the write request at the appropriate RAM resources. The PLD is partially reconfigured with the configuration bitstream via a configuration port of the PLD.

In other embodiments, the partial reconfiguration capabilities of an FPGA are used in combination with a shared memory for simulating a circuit design.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

A shared memory block may be used to interface between a design block in an HLMS and a design block implemented on a hardware-based co-simulation platform. The shared memory block may span the software and hardware platforms, may be hosted solely on the software platform (e.g., a shared memory between two software processes), or implemented only on the hardware platform (e.g., a shared memory, such as a FIFO, between two portions of a circuit.) In one specific implementation, the shared memory block may be implemented on the hardware-based co-simulation platform as a dual port memory.

Figure 1:
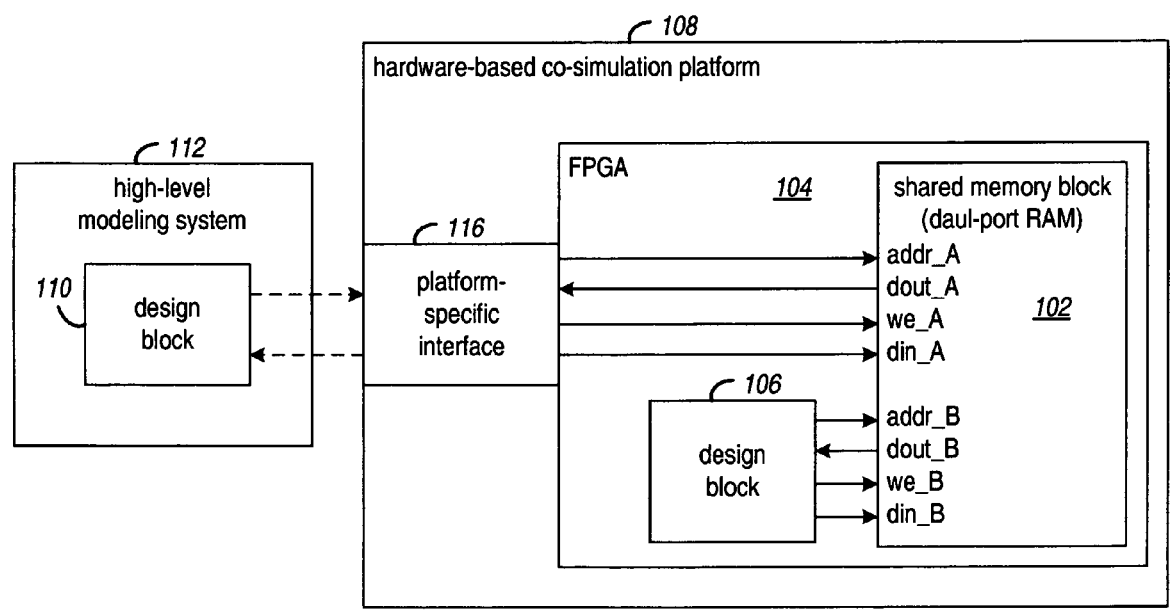
FIG. 1 is a block diagram that illustrates a shared memory block implemented on a programmable logic device for providing an interface between one design block simulated on a reconfigurable hardware-based co-simulation platform and another design block simulated in a software-based system such as a high-level modeling system (HLMS)

FIG. 1 is a block diagram that illustrates a shared memory block 102 implemented on a programmable logic device 104 for providing an interface between a design block 106 simulated on a reconfigurable hardware-based co-simulation platform 108 and a design block 110 simulated in a software-based system such as a high-level modeling system (HLMS) 112. In the example implementation the shared memory block is implemented as a dual-port memory using RAM resources of a field programmable gate array (FPGA), such as the BRAM of a Virtex FPGA from Xilinx. The design block 106 is implemented in the programmable logic, routing, and I/O resources of the FPGA. One of the ports of the dual-port memory may be dedicated to design block 106, and the other port may be dedicated to the platform-specific interface 116 required to communicate with the HLMS 112. For example, the A ports (addr_A, dout_A, we_A, and din_A) are dedicated to the platform-specific interface between the PLD and the HLMS 112, and the B ports (addr_B, dout_B, we_B, and din_B) are used by design block 106.

Dedicating the two ports of the dual-port memory in this manner, however, limits the design block 106 implemented on the FPGA to use of just one port of the dual-port memory (i.e., the convenience of having on-chip dual-port memory is sacrificed). Thus, a shared memory block implemented as shown in FIG. 1 is limited to a single-port interface to the design block 106, which may create unnecessary design complexity.

To provide dual-port shared memory functionality, the various embodiments of the invention use the partial reconfiguration and readback capabilities of a FPGA to support the interface between the shared memory block on the FPGA and the portion of the design not implemented in FPGA resources (e.g., an HLMS block). The Virtex family of FPGAs from Xilinx provides such partial reconfiguration and readback capabilities, for example. This leaves both ports of the dual-port memory available for use by the design block implemented in the FPGA.

Figure 2:
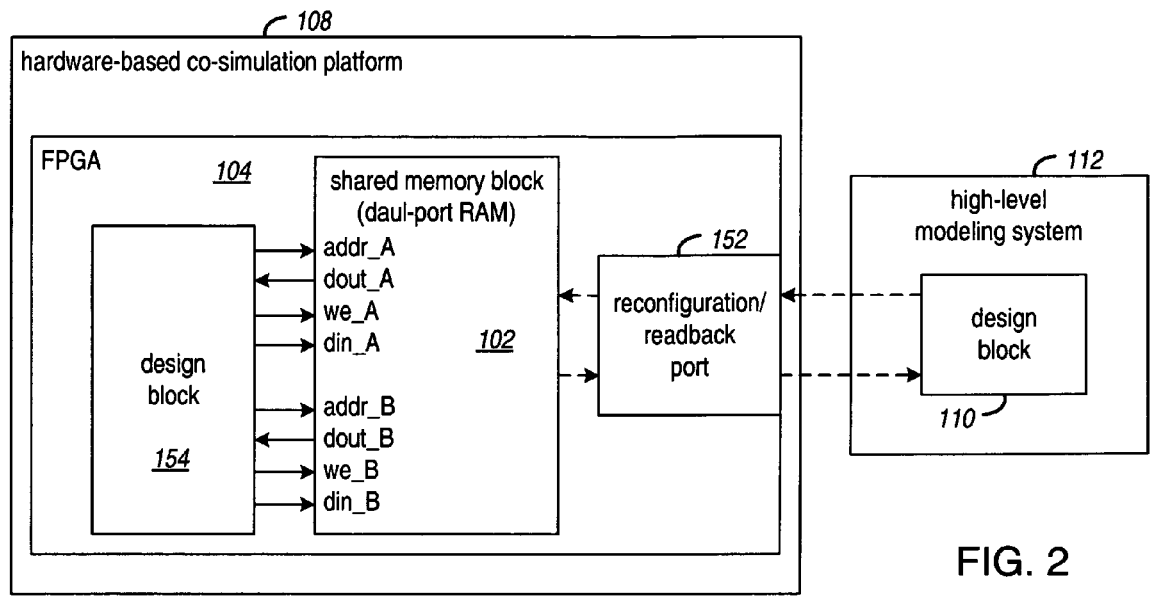
FIG. 2 illustrates a shared memory interface that uses partial reconfiguration capabilities of a programmable logic device for transferring data between co-simulated design blocks.

FIG. 2 illustrates a shared memory interface that uses partial reconfiguration capabilities of a programmable logic device for transferring data between co-simulated design blocks. The HLMS 112 uses a known interface to the reconfiguration/readback port 152 of the FPGA 104 to write data to and read data from the shared memory block 102. This leaves both the A ports and the B ports of the shared memory block 102 available for use by design block 154. Examples of procedures to perform partial reconfiguration and readback on an FPGA are disclosed in Xilinx, Inc. application notes, XAPP 290 entitled "Two Flows for Partial Reconfiguration: Module Based or Difference Based", Sep. 9, 2004, XAPP138 entitled "Virtex FPGA Series Configuration and Readback", Mar. 11, 2005, and XAPP139 entitled "Configuration and Readback of Virtex FPGAs Using (JTAG) Boundary Scan", Sep. 12, 2003, all three of which are herein incorporated by reference.

Some FPGAs may have more than one mechanism for providing the functions of the reconfiguration/readback port 152. For example, the reconfiguration and readback capabilities may be provided by way of a dedicated input/output pin for serial configuration and readback, multiple input/output pins for parallel transfer of configuration data, or boundary scan pins of the FPGA. Each approach requires a specification of a device relative address in order to access the appropriate data on the FPGA. Thus, each of the design blocks 110 and 154 operates with shared memory block addresses, and for design block 110 to read from or write to the shared memory block, the HLMS determines the FPGA relative address from the shared memory block address specified by the design block.

Devices such as the Virtex family of FPGAs from Xilinx support partial configuration and readback. This permits the HLMS to specify and write and read desired portions of the device such as a portion the device corresponding to an addressed part of a shared memory block. The HLMS may use a map of the high-level abstraction of the shared memory block to physical resources of the FPGA occupied by the shared memory block. This map may be constructed in compiling the design for co-simulation and include, for example, X and Y coordinates of a resource grid corresponding to resources of the FPGA. Data provided by various compilation tools may be used to construct the map. For example, compilation tools from Xilinx may be directed to produce a file of data that maps FPGA primitive types/names to the corresponding locations the resources occupy on the FPGA. The HLMS can then correlate the high-level abstraction of the shared memory block to these primitives using a string-based comparison of names (i.e., the name of the high-level shared memory block compared to names of FPGA primitives). During simulation, the resource mapping table may be further translated into block RAM locations that would be incorporated into the configuration and readback sequences for writing to and reading from the shared memory block.

The HLMS 112 implements the interface between simulated design block 110 and the reconfiguration/readback port in a manner that is FPGA-dependent and that is suitable for the particular simulation. For writing data by the design block 110 to the shared memory block 102, the HLMS 112 receives from the design block 110—the data to be written and the shared memory address at which the data is to be written. The HLMS generates a partial configuration bitstream to be used to write the data to the FPGA. In one particular approach, the partial configuration bitstream may be module based. For example, distinct reconfigurable portions of the FPGA may be reconfigured while the rest of the device remains operational; each distinct reconfigurable portion is a reconfigurable module. The modules may have device-relative requirements for minimum height, width, and alignment. Along with the configuration data, the HLMS generates the device relative address information needed to access the particular reconfiguration module. Known techniques may be used to implement the modular reconfiguration approach. Once the partial reconfiguration bitstream is generated, the HLMS issues the commands needed to control the reconfiguration/readback port 152 such as for serial, parallel, or boundary scan input. It will be recognized that the requirements and limitations imposed by a particular device for partial reconfiguration and readback will dictate the approach implemented by the HLMS for writing to and reading from a shared memory block. For example, in the Virtex family of devices partial reconfiguration and readback is accomplished through vertical frames, and in the Virtex-4 family of devices a finer granularity of partial reconfiguration and readback is provided by way of cell-based access.

For reading data from the shared memory block 102 by the design block 112, the HLMS 112 receives from the design block a shared memory block address from which the data is to be read. The HLMS determines the FPGA relative address of the shared memory block and the input shared memory block address and generates the command sequence to read from the FPGA the data referenced by the shared memory block address. The particular command sequence depends on the chosen implementation of the reconfiguration/readback port, for example, serial, parallel, or boundary scan. From the readback data returned from the reconfiguration/readback port to the HLMS, the HLMS returns to the design block 110 that data referenced by the input shared memory block address.

Figure 3:
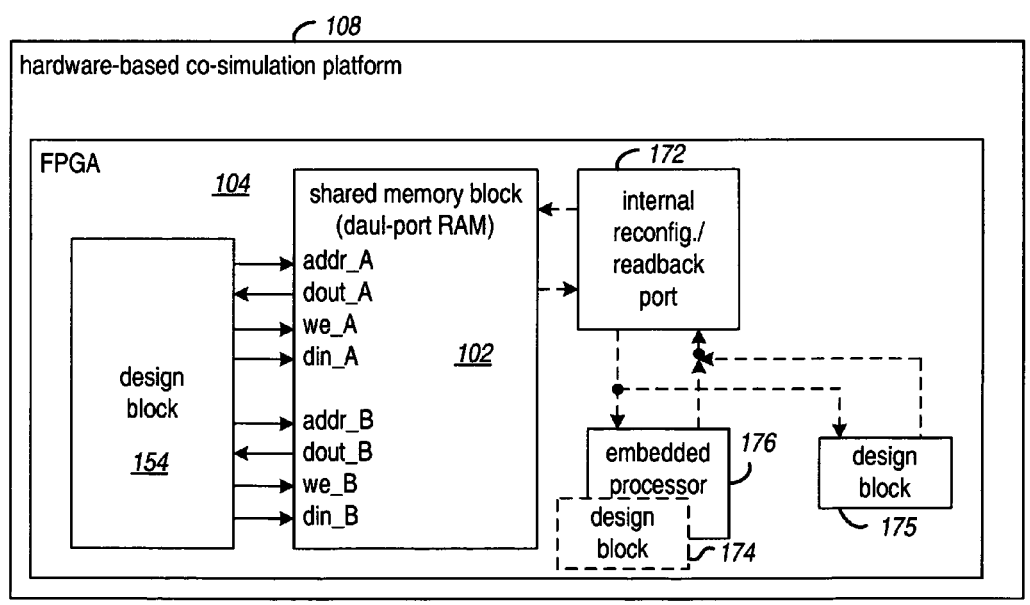
FIG. 3 illustrates a shared memory interface that uses the internal reconfiguration/readback port of a FPGA for transferring data between a design block implemented on an embedded processor of the FPGA and a shared memory block.

In an alternative embodiment, an internal reconfiguration/readback port may be used to provide an interface to the shared memory block for a design block implemented on the FPGA. FIG. 3 illustrates use of the internal reconfiguration/readback port 172 of a FPGA for transferring data between design blocks 174 and 175 implemented on the FPGA 104 and the shared memory block. Design block 174 is implemented on a processor 176 embedded in the FPGA, and design block 175 is implemented with FPGA configurable logic resources. The internal reconfiguration/readback port is accessible to circuits implemented in the configurable logic of the FPGA and to the embedded processor by way of configurable interconnect resources coupled to the port.

Some FPGAs, for example, the Virtex family of FPGAs, have an internal configuration access port (ICAP) that provides configuration and readback access to configuration resources of the FPGA for logic that is internal to the FPGA. In the example embodiment, the internal logic is the design block 174 implemented by way of code that executes on embedded processor 176. The Virtex-II Pro family of FPGAs is an example of FPGAs having embedded processors.

While not shown, it will be recognized that processor 176 also executes code that is dependent on the FPGA architecture for mapping an input shared memory block address to a location on the FPGA at which the data of the shared memory block is to be accessed, code for generating the partial configuration bitstream, and code for controlling configuration and readback modes of the internal reconfiguration/readback port. Similarly, design block 175 may interface directly with the internal port 172 via interface logic (associated with or implemented as part of design block 175) that controls configuration and readback modes of the internal port and that implements the mapping of shared memory block addresses to FPGA resource locations.

Figure 4:
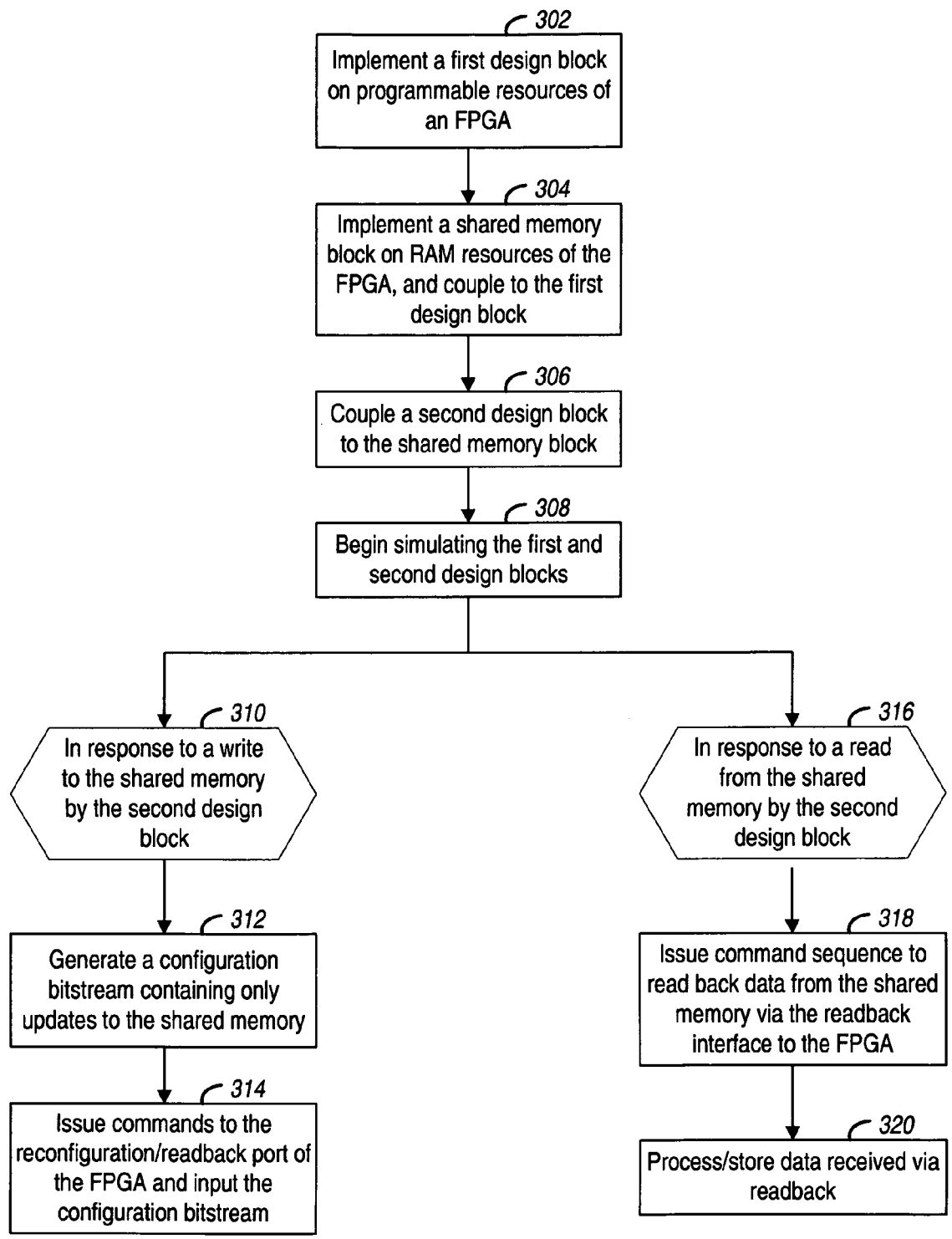
FIG. 4 is a flow diagram that illustrates a process for using a shared memory block and partial reconfiguration capabilities of an FPGA for interfacing between design blocks.

FIG. 4 is a flow diagram that illustrates a process for using a shared memory block and partial reconfiguration capabilities of an FPGA for interfacing between design blocks. A first design block is implemented on programmable resources of an FPGA (step 302), and a shared memory block is implemented on RAM resources of the FPGA and coupled to the first design block (step 304). In implementing the shared memory block, the HLMS creates a map that indicates the FPGA resources and locations in which the shared memory block is implemented. The map may then be used to determine device locations for partial reconfiguration and readback when simulated design blocks seek access to the shared memory block.

A second block is defined and coupled to the shared memory block via the HLMS (step 306). The second design block access the shared memory block via the reconfiguration/readback port as described above. FIGS. 5-9 and the accompanying description demonstrate an example embodiment for implementing a shared memory block on an FPGA. A tool such as an HLMS may be used to create the first and second design blocks, along with the shared memory block, and configure the FPGA accordingly.

An application-specific testbench may then be used to simulate operation of the first and second design blocks (step 308), with the HLMS managing the simulation of design blocks.

Access to the shared memory block by the FPGA-implemented design block 154 is by way of the A and B address ports as shown in FIGS. 2 and 3, with an example implementation described in FIGS. 5-9.

In response to a write request to the shared memory block from the second design block (step 310), a configuration bitstream is generated to update that part of the FPGA having the shared memory block (step 312). The write request from the design block includes an address of the shared memory block along with the data to be written at that address. From the shared memory block address, the correct configuration location on the FPGA is determined for the configuration bitstream. The device location may be determined from the map that indicates the FPGA resources and locations in which the shared memory block is implemented, as established during compilation of the design. The address in the write request may be used as an offset from a base location on the FPGA assigned to the shared memory block. Commands are then issued to the reconfiguration/readback port and the configuration bitstream is input to the FPGA (step 314). The commands and configuration bitstream input to the reconfiguration/readback port specify the partial reconfiguration function, the device location at which reconfiguration is to occur, and the data to be written to that location.

Reading data from the shared memory block by the second design block is also performed via the reconfiguration/readback port. In response to a read request from the second design block (step 316), the location of the FPGA of the shared memory block address specified by the read request is determined, and the FPGA-specific commands are issued to the reconfiguration/readback port for reading back the referenced data (step 318). For reading from the shared memory block, the manner in which the device location is determined for the requested address in the read request is similar to the manner in which the device location is determined for writing to the shared memory block. The second design block continues the simulation with further processing of the data from the shared memory block as returned via the reconfiguration readback port (step 320).

Figure 5:
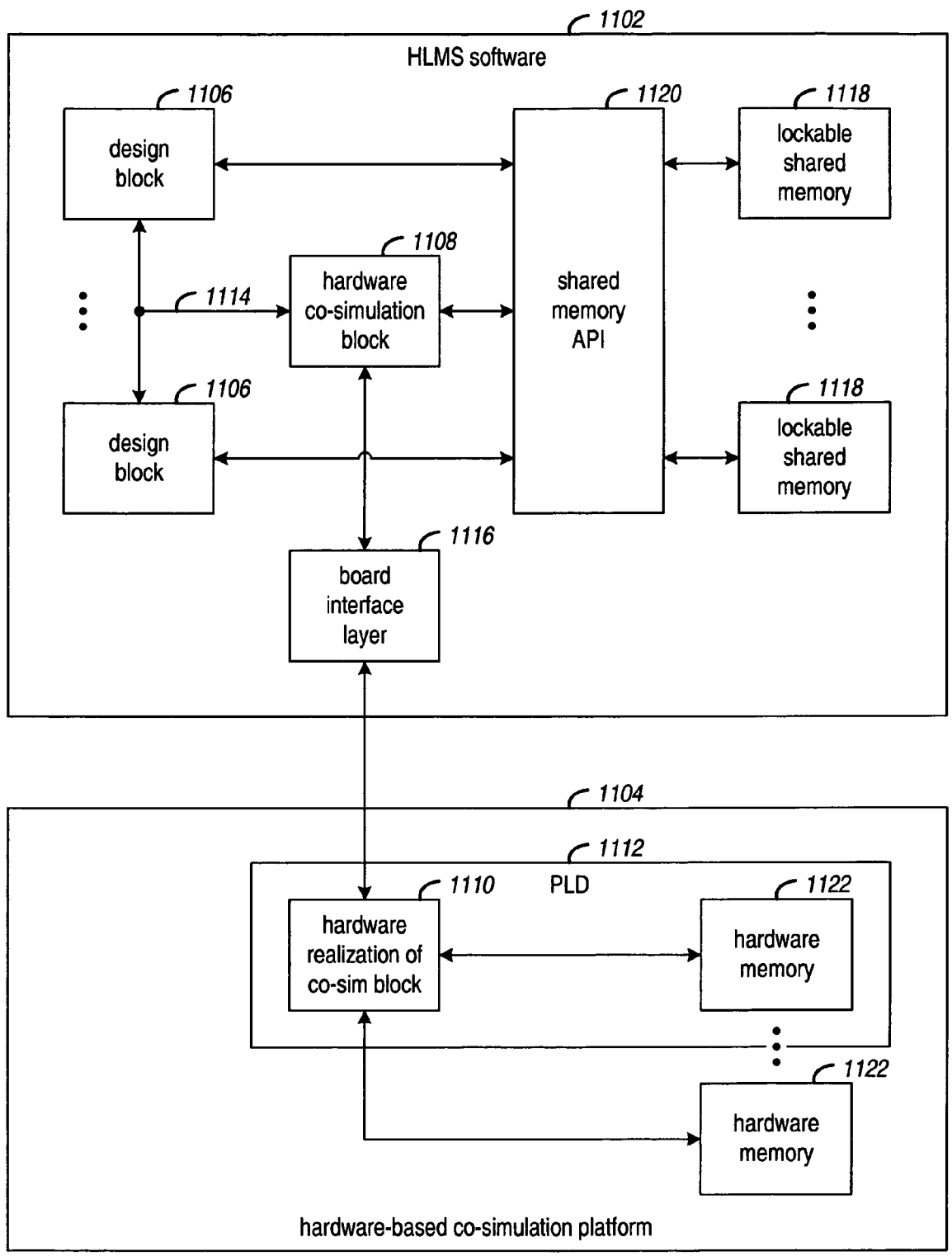
FIG. 5 is a block diagram of a simulation arrangement including an HLMS and a hardware-based co-simulation platform.

FIGS. 5-9 illustrate an example embodiment of a lockable shared memory interface between a high-level modeling system and a hardware based co-simulation platform. FIG. 5 is a block diagram of a simulation arrangement including an HLMS 1102 and a hardware-based co-simulation platform 1104. The HLMS 1102 and the hardware-based co-simulation platform 1104 cooperate to perform a simulation of a circuit design.

The circuit design includes design blocks 1106 and a co-simulation block having a proxy, hardware co-simulation block 1108, in the HLMS 1102 and having hardware realization 1110 in PLD 1112 on the hardware-based co-simulation platform 1104. The HLMS 1102 simulates design blocks 106 in software on a general purpose computer or a collection of networked computers and the co-simulation block is simulated in hardware by realization 1110 on the hardware-based co-simulation platform 1104.

Inputs and outputs for the blocks of the circuit design may be communicated during simulation by signals represented by lines 1114. The hardware co-simulation block 1108 acts as a proxy in HLMS 1102 for the hardware realization 1110 of the co-simulation block. The inputs on lines 1114 for the co-simulation block are received by the hardware co-simulation block 1108 and sent to the hardware realization 1110 of the co-simulation block via board interface layer 1116. The outputs of the hardware realization 1110 of the co-simulation block are sent via board interface layer 1116 to the hardware co-simulation block 1108, which transmits the outputs on lines 1114.

In addition to communication using signals on lines 1114, the design blocks 1106 and the hardware co-simulation block 1108 may communicate during simulation using shared memory blocks, such as lockable shared memory blocks 1118. Shared memory blocks, such as 1118, can be accessed by design blocks 1106 and hardware co-simulation block 1108 via the application programming interface (API) 1120 for shared memory. Shared memory blocks 1118 may be locked for exclusive access by one of the design blocks 1106 or the hardware co-simulation block 1108.

Each lockable shared memory block 1118 may have a corresponding hardware memory 1122 in the hardware-based co-simulation platform 1104. The data for a lockable shared memory 1118 may be duplicated in the corresponding hardware memory 1122, allowing the hardware realization 1110 of the co-simulation block to access the same data from a hardware memory 1122 that a design block 1106 can access from the corresponding lockable shared memory block 1118. Thus, a lockable shared memory block 1118 provides a local copy for the HLMS 1102 of data in a memory block of the circuit design and a hardware memory 1112 provides a local copy for the hardware-based co-simulation platform 1104 of the data in the memory block.

Because there are two copies 1118 and 1122 of the data for a memory block, data synchronization is required to maintain data coherency. To maintain data coherency, the data from a lockable shared memory block 1118 may be transferred to the corresponding hardware memory 1122 before the hardware realization 1110 of the co-simulation block begins accessing the hardware memory 1122, and subsequently the data from the hardware memory 1122 may be transferred back to the lockable shared memory block 1118 after the hardware realization 1110 of the co-simulation block completes accessing the hardware memory 1118. The data transfer in each direction may be a burst data transfer to efficiently utilize the communication link 1124, such as PCI or USB, between the HLMS computer 1102 and the hardware-based co-simulation platform 1104.

It will be appreciated that certain memory blocks of the circuit design may be accessed only from design blocks 1106, and thus do not need to be duplicated in hardware memories 1122. In addition, a hardware memory 1122 may be comprised of memory resources within PLD 1112, an external memory device, or various combinations thereof.

Figure 6:
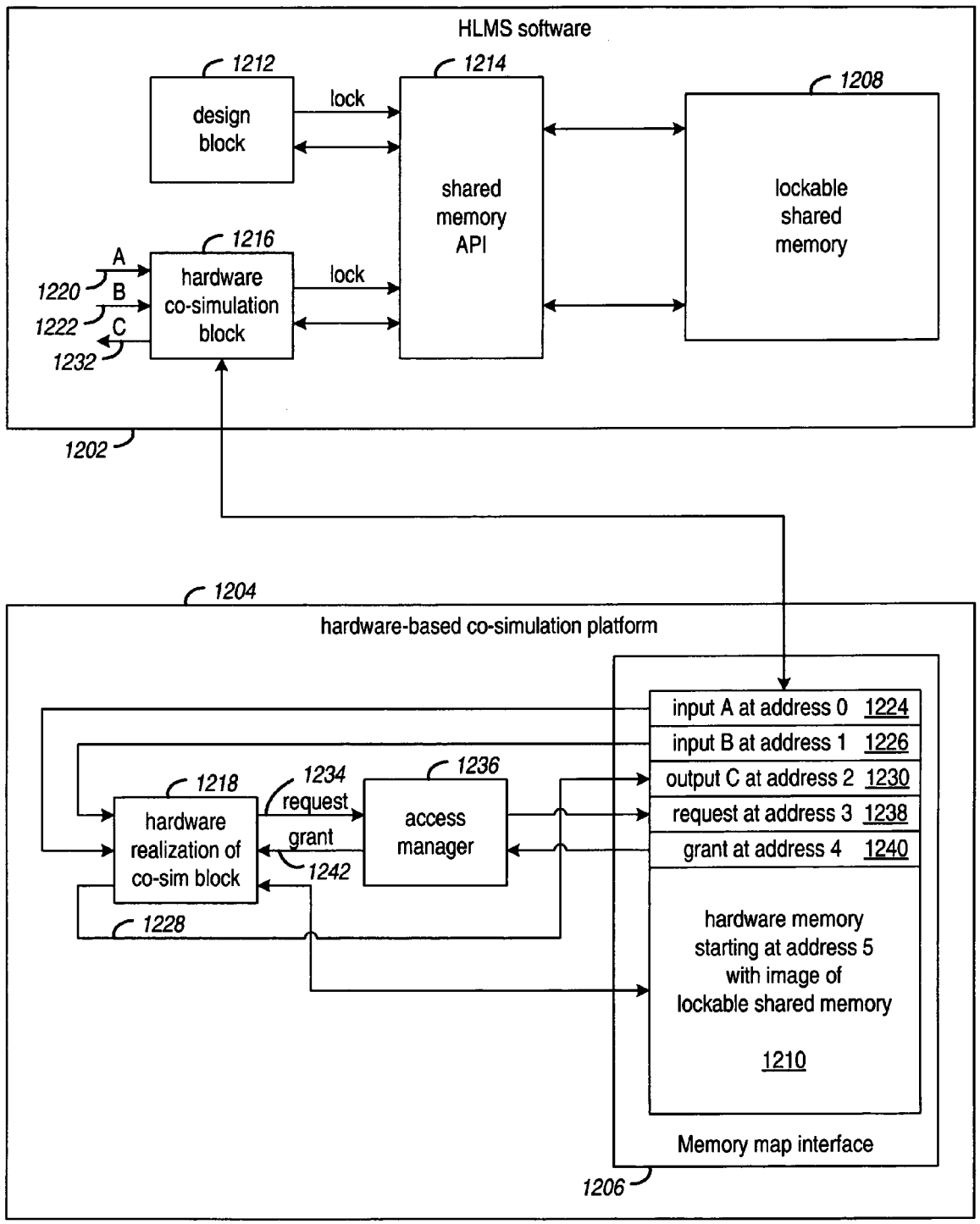
FIG. 6 is a block diagram of a simulation arrangement in which an HLMS and a hardware-based co-simulation platform use a memory map interface to manage a memory block.

FIG. 6 is a block diagram of a simulation arrangement in which an HLMS 1202 and a hardware-based co-simulation platform 1204 use a memory map interface 1206 to manage a memory block. The data in the memory block is duplicated in the lockable shared memory block 1208 and the hardware memory 1210 in the memory map interface 1206, for example, starting at address five.

During simulation, design block 1212 accesses the lockable shared memory block 1208 via the shared memory API 1214 and the design block 1212 should lock the lockable shared memory block 1208 before access. The lock enforces mutually exclusive access to the lockable shared memory block 1208, for example, the design block 1212 may not obtain the lock from the shared memory API 1214 if the lockable shared memory block 208 is already locked by the hardware co-simulation block 1216. Conversely, the hardware co-simulation block 1216 may not obtain the lock from the shared memory API 1214 if the lockable shared memory block 1208 is already locked by the design block 1212. If the lockable shared memory block 1208 is already locked, a block 1212 or 1216 requesting the lock may not obtain the lock until the lock is released. Typically, a block 1212 or 1216 releases the lock when the block has completed accessing the lockable shared memory 1208.

Hardware co-simulation block 1216 acts as a proxy in the HLMS 1202 for the hardware realization 1218 of the co-simulation block. During simulation, the hardware co-simulation block 1216 receives inputs, for example inputs A and B on lines 1220 and 1222 respectively, from simulation blocks, such as design block 1212. The hardware co-simulation block 1216 forwards the values of the inputs on lines 1220 and 1222 to locations zero (1224) and one (1226) of the memory map interface 1206, and locations zero and one are connected to the hardware realization 1218 of the co-simulation block as corresponding inputs. During simulation, the hardware realization 1218 of the co-simulation block may generate output values, for example the output on line 1228 sent to location two 1230 in memory map interface 1206. The hardware co-simulation block 1216 may read location two 1230 of the memory map interface 1206 and forward the value to the output C on line 1232.

To access the data in the memory block, the hardware realization 1218 of the co-simulation block sends a request on line 1234 via access manager 1236 to location three (1238) in the memory map interface 1206. In response to reading the request from location three 1238 in the memory map interface 1206, the hardware co-simulation block 1216 locks the lockable shared memory block 1208. The locking of the lockable shared memory block 1208 by the hardware co-simulation block 1216 may be delayed if the lockable shared memory 1208 is already locked. After acquiring the lock to the lockable shared memory block 1208, the hardware co-simulation block 1216 reads the data from the lockable shared memory block 1208, and forwards the data to the hardware memory 1210 in the memory map interface 1206. The data read and/or forwarded may be limited to a subset of the data in the lockable shared memory block 1208 that includes modified data, as is later discussed in detail. After the data forwarding is complete, the hardware co-simulation block 1216 sends a grant to location four 1240 of memory map interface 1206. The hardware realization 1218 of the co-simulation block receives the grant on line 1242 via the access manager 1236.

On receiving the grant on line 1242, the hardware realization 1218 of the co-simulation block may process the data in the hardware memory 1210. After completing the processing of the data in the hardware memory 1210, the hardware realization 1218 of the co-simulation block sends a released request on line 1234 via access manager 236 to location three 1238 in the memory map interface 1206. In response to reading the released request from location three 1238 in the memory map interface 1206, the hardware co-simulation block 1216 reads the data from the hardware memory 1210 in the memory map interface 1206, and forwards the data to the lockable shared memory block 1208. The data read and/or forwarded may be limited to a subset of the data in the lockable shared memory block 1208 that includes modified data, as is later discussed in detail. After the data forwarding is complete, the hardware co-simulation block 1216 unlocks the lockable shared memory 1208 and sends a released grant to location four 1240 of memory map interface 1206. The hardware realization 1218 of the co-simulation block receives a released grant on line 1242 from the access manager 1236, as is later discussed in detail in connection with FIG. 8.

Figure 7:
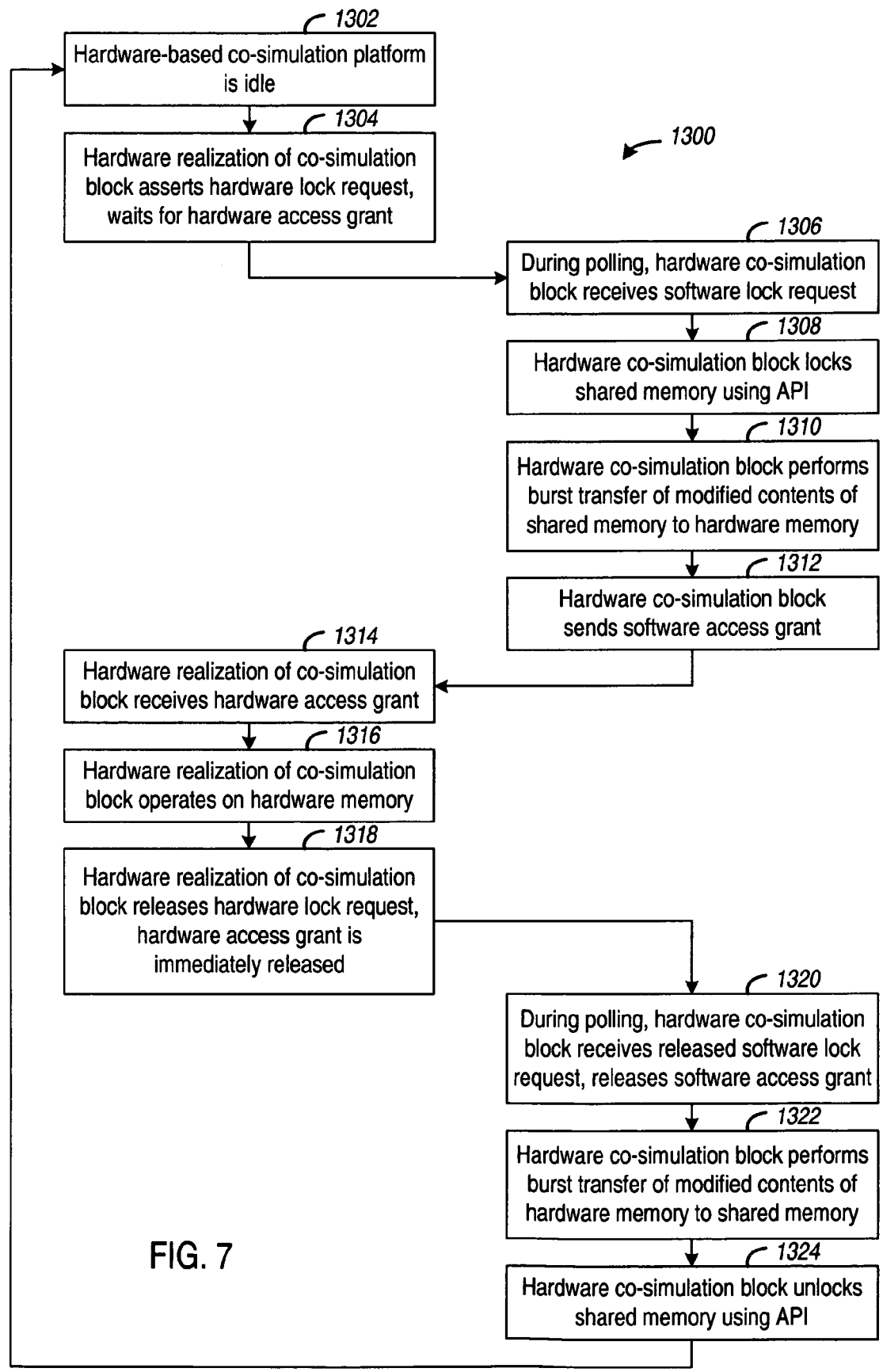
FIG. 7 is a flow diagram of an example parallel process for accessing shared memory during co-simulation.

FIG. 7 is a flow diagram of an example parallel process 1300 for accessing shared memory during co-simulation. Steps 1302, 1304, 1314, 1316, and 1318 are performed by a hardware-based co-simulation platform and steps 1306, 1308, 1310, 1312, 1320, 1322, and 1324 are performed by HLMS software on a general purpose computer. It will be appreciated that parallel process 1300 may be readily extended to multiple shared memories.

At step 1302, the hardware-based co-simulation platform is idle. At step 1304, the hardware realization of the co-simulation block requests access to the data in a memory block by asserting a hardware lock request. The hardware realization of the co-simulation block waits to receive a hardware access grant before accessing the data for the memory block in a hardware memory.

At step 1306, the hardware co-simulation block in the HLMS actively polls for a software lock request. On receiving a software lock request resulting from the hardware lock request, the HLMS proceeds to step 1308. At step 1308, the hardware co-simulation block locks the shared memory using a shared memory API. The lock may not be obtained immediately if the shared memory is already locked. On obtaining the lock for the shared memory, the HLMS proceeds to step 1310. It will be appreciated that the HLMS may be performing a portion of the simulation including accessing the shared memory in parallel with steps 1306 and 1308, and the HLMS may be performing a portion of the simulation that does not access the shared memory in parallel with steps 1306, 1308, 1310, 1312, 1320, 1322, and 1324.

At step 1310, the hardware co-simulation block performs data synchronization between the shared memory block and the hardware memory in the hardware-based co-simulation platform. After data synchronization, the software memory and the hardware memory contain coherent data. Generally, the data synchronization transfers to the hardware memory at least the data modified by the HLMS in the shared memory since the previous data synchronization. Typically, the transfer uses a burst data transfer, such as transferring values for multiple memory locations in each of one or more transactions. At step 1312, the hardware co-simulation block sends a software grant to the hardware-based co-simulation platform.

At step 1314, the hardware realization of the co-simulation block receives a hardware grant resulting from the software grant, enabling the hardware realization of the co-simulation block to process the data in the hardware memory at step 1316. At step 1318, the hardware realization of the co-simulation block releases the hardware lock request. Typically, the hardware access grant received by the hardware realization of the co-simulation block is immediately released.

At step 1320, the hardware co-simulation block in the HLMS actively polls for a released software lock request. On receiving a released software lock request corresponding to the released hardware lock request, the HLMS proceeds to step 1322. At step 1322, the hardware co-simulation block performs data synchronization between the shared memory and the hardware memory. After data synchronization, the software memory and the hardware memory contain corresponding data values. Generally, the data synchronization transfers to the shared memory at least the data modified by the hardware realization of the co-simulation block in the hardware memory since the previous data synchronization. Typically, the transfer uses a burst data transfer. At step 1324, the hardware co-simulation block unlocks the shared memory using the shared memory API.

Figure 8:
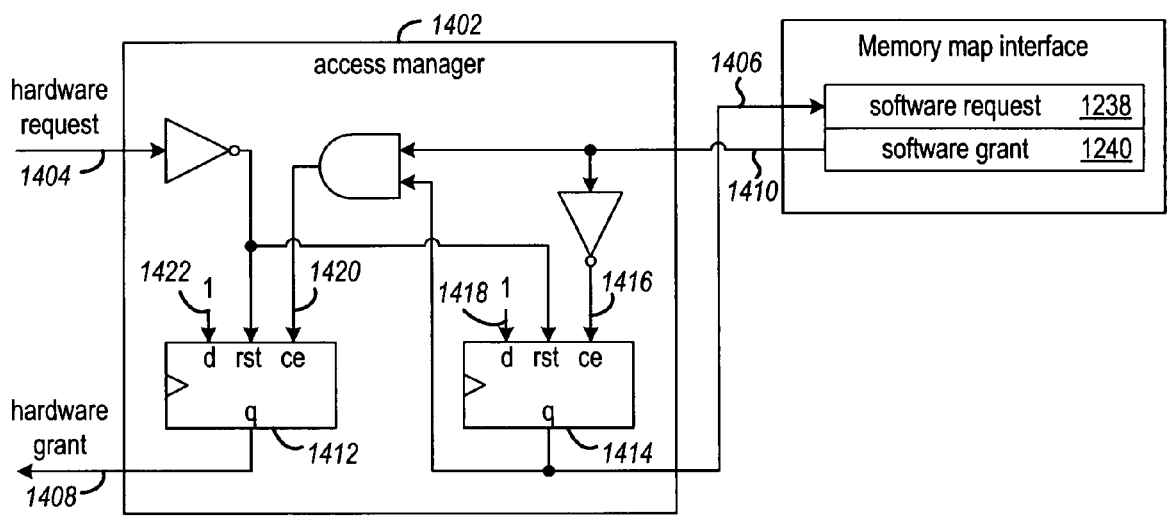
FIG. 8 is a block diagram of an access manager for managing access request and grant signals, according to various embodiments of the invention.

FIG. 8 is a block diagram of an access manager 1402 for managing access request and grant signals on lines 1404, 1406, 1408, and 1410, according to various embodiments of the invention. The access manager 1402 propagates the hardware access request on line 1404 into a corresponding software access request on line 1406, while generating a hardware grant on line 1408 and synchronizing with the software grant on line 1410. In one embodiment, a hardware realization of the co-simulation block requires that the hardware access grant on line 1408 be released immediately after the releasing of the hardware access request on line 1404, as provided by the access manager 1402.

Initially, the inputs on lines 1404 and 1410 are released with a deasserted value. The released value for the hardware access request on line 1404 causes registers 1412 and 1414 to be reset, releasing the hardware access grant on line 1408 and the software access request on line 1406. The assertion of a hardware access request on line 1404 combined with the continuing released value for the software access grant on line 1410 causes register 1414 to no longer be reset and to be enabled by clock enable on line 1416 to latch the asserted data input on line 1418. Thus, software access request on line 1406 is asserted the cycle after the assertion of the hardware access request on line 1404.

Eventually, the HLMS responds to the asserted software access request on line 1406 with a software access grant on line 1410. The combination of the asserted software access request on line 1406 and the asserted software access grant on line 1410 causes register 1412 to be enabled by clock enable on line 1420 to latch the asserted data input on line 1422. Thus, hardware access grant on line 1408 is asserted the cycle after the assertion of the software access grant on line 1410.

After completing an operation, the hardware realization of the co-simulation block deasserts the hardware access request on line 1404, immediately causing registers 1412 and 1414 to be reset, releasing the hardware access grant on line 1408 and the software access request on line 1406. The HLMS may have a delay interval before responding by deasserting the software access grant on line 1410, but until the HLMS deasserts software access grant on line 1410, register 1414 is prevented by clock enable on line 1416 from asserting another software access request on line 1406, which in turn causes the clock enable on line 1420 to prevent register 1412 from asserting another hardware access grant on line 1408.

Figure 9:
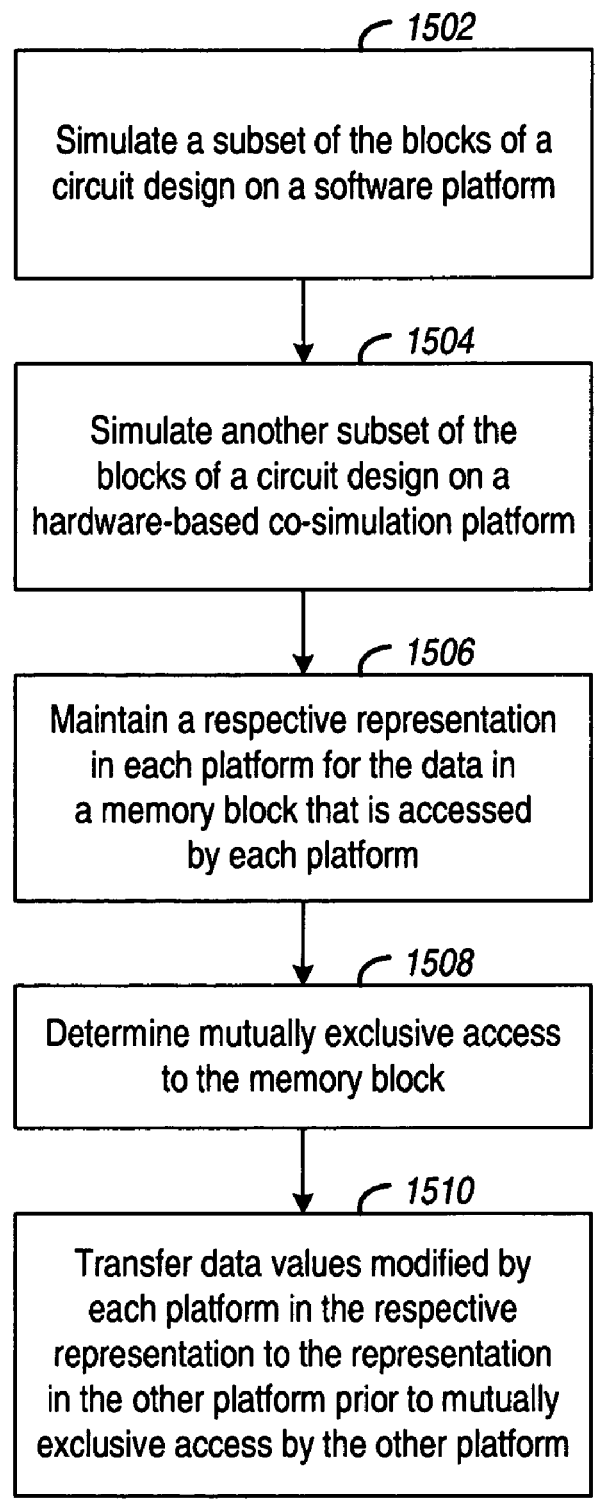
FIG. 9 is a flow diagram of a process for hardware co-simulation using shared memory.

FIG. 9 is a flow diagram of a process for hardware co-simulation using shared memory. Typically, one design block, which may be a block hierarchy, of a circuit design is selected to be simulated in hardware during hardware co-simulation, one or more shared memory blocks are simulated in a combination of hardware and software, and the remaining design blocks are simulated in software.

At step 1502, a subset of the blocks of a circuit design is simulated on a software platform, typically in a HLMS on a general purpose computer. At step 1504, another subset of the blocks of a circuit design is simulated in hardware on a hardware-based co-simulation platform. At step 1506, a hardware representation and a software representation are maintained for the data in a memory block. The hardware representation is maintained in hardware memory on the hardware-based co-simulation platform and the software representation is maintained in memory on the software platform, such as lockable shared memory.

At step 1508, mutually exclusive access to the data in the memory block is determined. Mutually exclusive access to the data may be provided by appropriate semaphore operations on the general purpose computer, such as may be provided by lockable shared memory. Mutually exclusive access to the data of a memory block may be split between the subset of the blocks simulated in software and the subset of the blocks simulated in hardware. In one embodiment, mutually exclusive access may be further split between the individual blocks of the subset of blocks simulated in software. While the blocks simulated in hardware are determined to have mutually exclusive access, the hardware-based co-simulation platform may access the data for the memory block using the hardware representation. While a block simulated in software is determined to have mutually exclusive access, the software platform may access the data for the memory block using the software representation.

At step 1510, prior to mutually exclusive access to the data for the memory block from the hardware-based co-simulation platform, any of the data modified by the software platform is transferred from the software representation to the hardware representation. In addition, prior to mutually exclusive access to the data for the memory block from the software platform, and typically after the completion of a mutually exclusive access from the hardware-based co-simulation platform, any of the data modified by the hardware-based co-simulation platform is transferred from the hardware representation to the software representation.

The transferring of the data for the memory block between the hardware and software representations may use a burst data transfer to accomplish efficient data transfer. In one embodiment, the modified data may be transferred by unconditionally transferring all of the data for the memory block. In a second embodiment, the modified data may be transferred by transferring all of the data for the memory block if any of the data for the memory block is modified. In a third embodiment, the modified data may be transferred by transferring a contiguous range of locations for the memory block that includes all of the modified data. In a fourth embodiment, the modified data may be transferred by transferring a modification history including a sequence of pairings of location address and update value.

In an example simulation, the memory block may accessed by a producer, which writes to the memory block but does not read from the memory block, and a consumer, which reads from the data block but does not write to the memory block. If the producer is a block simulated on the software platform and the consumer is a block simulated on hardware-based co-simulation platform, step 1510 need only transfer data from the software representation to the hardware representation. Conversely, if the producer is a block simulated on the hardware-based co-simulation platform and the consumer is a block simulated on software platform, step 1510 need only transfer data from the hardware representation to the software representation.

Figure 10:
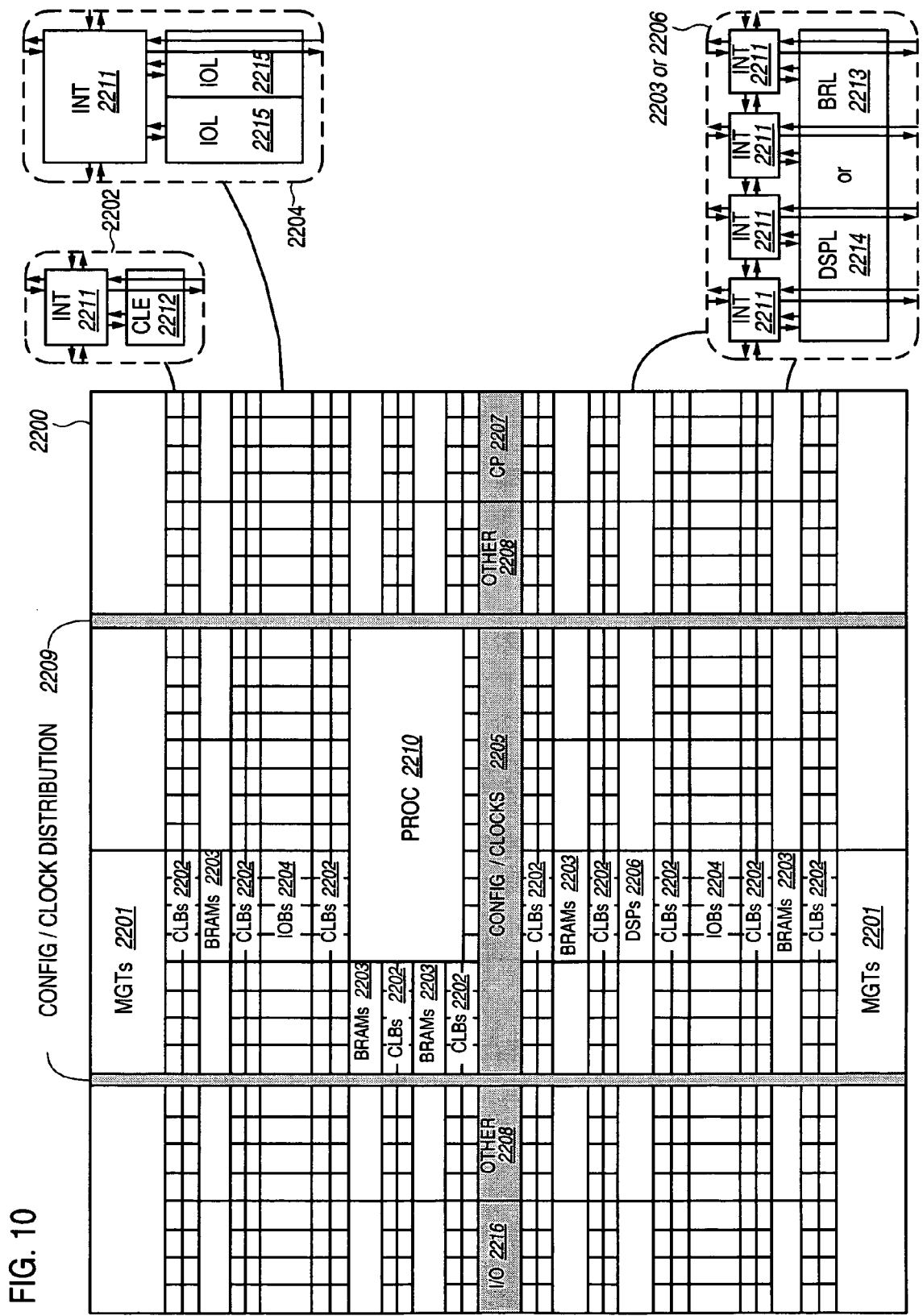
FIG. 10 illustrates the architecture of an example FPGA 2200 that includes a large number of different programmable resources.

FIG. 10 illustrates the architecture of an example FPGA 2200 that includes a large number of different programmable resources, such as resources 2201 through 2204. The programmable resources of FPGA 2200 may be programmed with configuration values from a configuration storage medium to implement a wide variety of functions. The configurable resources of FPGA 2200 are arranged in columns of tiles including multi-gigabit transceivers (MGTs 2201), configurable logic blocks (CLBs 2202), random access memory blocks (BRAMs 2203), input/output blocks (IOBs 2204), configuration and clocking logic (CONFIG/CLOCKS 2205), digital signal processing blocks (DSPs 2206), configuration port (CP 2207), specialized input/output block (I/O 2216) (e.g., clock ports), and other programmable logic 2208 such as digital clock managers, analog-to-digital converters, system monitoring logic, and so forth. Some FPGAs also include dedicated processor blocks (PROC 2210).

In some FPGAs, each programmable tile includes a programmable interconnect element (INT 2211) having standardized connections to and from a corresponding interconnect element in each adjacent tile. Therefore, the programmable interconnect elements taken together implement the programmable interconnect structure for the illustrated FPGA. The programmable interconnect element (INT 2211) also includes the connections to and from the programmable logic element within the same tile, as shown by the example 2202.

For example, a CLB 2202 can include a single programmable interconnect element (INT 2211) and a configurable logic element (CLE 2212) that can be programmed to implement user logic. A BRAM 2203 can include a BRAM logic element (BRL 2213) in addition to one or more programmable interconnect elements. One or more of the BRL 2213 may be used to implement a shared memory block. The number of interconnect elements included in a tile may depend on the height of the tile. In the pictured embodiment, a BRAM tile has the same height as four CLBs, but other numbers (e.g., five) can also be used.

A DSP tile 2206 can include a DSP logic element (DSPL 2214) in addition to an appropriate number of programmable interconnect elements. An IOB 2204 can include, for example, two instances of an input/output logic element (IOL 2215) in addition to one instance of the programmable interconnect element (INT 2211). As will be clear to those of skill in the art, the actual I/O pads connected, for example, to the I/O logic element 2215 are manufactured using metal layered above the various illustrated logic blocks, and are not confined to the area of the input/output logic element 2215.

In the pictured embodiment, a columnar area near the center of the die (shown shaded) is used for configuration, clock, and other control logic. Horizontal areas 2209 extending from this column are used to distribute the clocks and configuration signals across the breadth of the FPGA.

Some FPGAs utilizing the example architecture include additional logic blocks that disrupt the regular columnar structure making up a large part of the FPGA. The additional logic blocks can be programmable blocks and/or dedicated logic. For example, the processor block PROC 2210 spans several columns of CLBs and BRAMs.

Note that FPGA 2200 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations are examples. For example, more than one adjacent column of CLBs may be included wherever the CLBs appear to facilitate the efficient implementation of user logic. It will be appreciated that PLDs having different layouts of CLBs, IOBs, and interconnect circuitry (and the functional equivalents thereof) may also implement the various embodiments of the invention described herein.

The MGTs 2201 and IOBs 2204 may be configurable to support external communication using various communication standards, including configurable drive strengths and configurable drive levels. CLBs 2202 may each include a look-up table that may be configured to implement any logic function that has up to 4-bits of input data and 1-bit of output data. The programmable interconnect elements 2211 may be configurable to allow various interconnections between the MGTs 2201, IOBs 2204, CLBs 2202, and BRAMs 2203. The BRAMs 2203 may be configurable to implement memory of various types, such as dual or single port RAM or read-only memory (ROM) of various sizes and data widths having either synchronous or asynchronous interfaces. In addition, BRAMs 2203 may be configurable with a set of values for the initial contents of the BRAMs.

Various embodiments of the present invention are described in terms of specific components of a particular instance of a field programmable gate array (FPGA). Those skilled in the art will appreciate, however, that the invention could be implemented in different FPGA architectures, other types of programmable logic devices (PLDs) other than FPGAs, integrated circuits that include programmable logic circuitry and/or adapted to various application requirements, based on both volatile and non-volatile technologies.

The present invention is thought to be applicable to a variety of systems for co-simulating circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for communicating between two blocks of an electronic circuit design, comprising:
    implementing a shared memory on RAM resources of a programmable logic device (PLD);
    implementing on programmable resources of the PLD a first design block coupled to the shared memory;
    coupling a second design block to the shared memory;
    in response to a write request by the second design block, the write request including a first shared memory address and data to be written to the shared memory at the first shared memory address,
        determining RAM resources of the PLD that correspond to the first shared memory address;
        generating a configuration bitstream, the configuration bitstream including configuration data for partial reconfiguration of the PLD with the data from the write request at the RAM resources corresponding to the shared memory address; and
        partially reconfiguring the PLD with the configuration bitstream via a configuration port of the PLD.

2. The method of claim 1, further comprising:
    in response to a read request by the second design block, the read request including a second shared memory address,
        determining RAM resources of the PLD that correspond to the second shared memory address;
        providing commands to the configuration port for reading back configuration data from the RAM resources of the PLD that correspond to the second shared memory address, wherein the commands reference the subset of the RAM resources that correspond to the second shared memory address; and
        providing to the second design block configuration data received via the configuration port.

3. The method of claim 2, wherein the shared memory is a dual port memory.

4. The method of claim 3, wherein the first design block is coupled to first and second ports of the shared, dual port memory.

5. The method of claim 3, further comprising implementing the second design block external to the PLD.

6. The method of claim 3, wherein the configuration port is an internal configuration port of the PLD, the method further comprising implementing the second design block internal to the PLD.

7. The method of claim 6, wherein implementing the second design block includes implementing the second design block on configurable resources of the PLD.

8. The method of claim 6, wherein the PLD includes an embedded processor and implementing the second design block includes implementing the second design block on the embedded processor.

9. The method of claim 1, further comprising implementing the second design block external to the PLD.

10. The method of claim 2, wherein the configuration port is an internal configuration port of the PLD, the method further comprising implementing the second design block internal to the PLD.

11. The method of claim 10, wherein implementing the second design block includes implementing the second design block on configurable resources of the PLD.

12. The method of claim 10, wherein the PLD includes an embedded processor and implementing the second design block includes implementing the second design block on the embedded processor.

13. A method for simulating an electronic circuit design, comprising:
    implementing a shared memory on RAM resources of a field programmable gate array (FPGA);
    simulating a first design block implemented on programmable resources of the FPGA, wherein the first design block is coupled to the shared memory;
    simulating a second design block that is coupled to the shared memory;
    in response to a write request by the second design block during simulation of the second design block, the write request including a first shared memory address and data to be written to the shared memory at the first shared memory address,
        determining RAM resources of the FPGA that correspond to the first shared memory address;
        generating a configuration bitstream, the configuration bitstream including configuration data for partial reconfiguration of the FPGA with the data from the write request at the RAM resources corresponding to the shared memory address; and
        partially reconfiguring the FPGA with the configuration bitstream via a configuration port of the FPGA.

14. The method of claim 13, further comprising:
    in response to a read request by the second design block during simulation of the second design block, the read request including a second shared memory address,
        determining RAM resources of the FPGA that correspond to the second shared memory address;
        providing commands to the configuration port for reading back configuration data from the RAM resources of the FPGA that correspond to the second shared memory address, wherein the commands reference the subset of the RAM resources that correspond to the second shared memory address; and
        providing to the second design block configuration data received via the configuration port.

15. The method of claim 14, wherein the shared memory is a dual port memory.

16. The method of claim 15, wherein the first design block is coupled to first and second ports of the shared, dual port memory.

17. The method of claim 15, further comprising implementing the second design block external to the FPGA.

18. The method of claim 15, wherein the configuration port is an internal configuration port of the FPGA, the method further comprising implementing the second design block internal to the FPGA.

19. An apparatus for simulating an electronic circuit design, comprising:

means for implementing a shared memory on RAM resources of a field programmable gate array (FPGA);

means for simulating a first design block implemented on programmable resources of the FPGA, wherein the first design block is coupled to the shared memory;

means for simulating a second design block that is coupled to the shared memory; and means, responsive to a write request by the second design block during simulation of the second design block, the write request including a first shared memory address and data to be written to the shared memory at the first shared memory address, for determining RAM resources of the FPGA that correspond to the first shared memory address, for generating a configuration bitstream, the configuration bitstream including configuration data for partial reconfiguration of the FPGA with the data from the write request at the RAM resources corresponding to the shared memory address; and for partially reconfiguring the FPGA with the configuration bitstream via a configuration port of the FPGA.

* * * * *